United States Patent
Fujimura et al.

(10) Patent No.: US 7,948,796 B2
(45) Date of Patent: May 24, 2011

(54) NONVOLATILE SEMICONDUCTOR MEMORY DEVICE AND METHOD FOR CONTROLLING THE SAME

(75) Inventors: Tomofumi Fujimura, Yokohama (JP); Kosuke Yanagidaira, Fujisawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 54 days.

(21) Appl. No.: 12/478,172

(22) Filed: Jun. 4, 2009

(65) Prior Publication Data
US 2009/0303790 A1    Dec. 10, 2009

(30) Foreign Application Priority Data
Jun. 10, 2008    (JP) ................................. 2008-151807

(51) Int. Cl.
*G11C 11/34* (2006.01)
(52) U.S. Cl. ............................... 365/185.03; 365/185.24
(58) Field of Classification Search ............. 365/185.03, 365/185.24
See application file for complete search history.

(56) References Cited

U.S. PATENT DOCUMENTS

| | | | |
|---|---|---|---|
| 7,016,230 B2 | 3/2006 | Hosono | |
| 7,333,371 B2 * | 2/2008 | Hosono | 365/189.05 |
| 2006/0227618 A1 | 10/2006 | Lee | |
| 2007/0258289 A1 * | 11/2007 | Lue | 365/185.18 |
| 2008/0049521 A1 | 2/2008 | Micheloni et al. | |
| 2008/0080258 A1 * | 4/2008 | Wang | 365/185.33 |
| 2008/0137422 A1 * | 6/2008 | Hosono | 365/185.17 |
| 2009/0113259 A1 * | 4/2009 | Aritome | 714/721 |

FOREIGN PATENT DOCUMENTS

| | | |
|---|---|---|
| JP | 2005-116102 | 4/2005 |
| JP | 2007-305204 | 11/2007 |

* cited by examiner

*Primary Examiner* — Michael T Tran
(74) *Attorney, Agent, or Firm* — Oblon, Spivak, McClelland, Maier & Neustadt, L.L.P.

(57) ABSTRACT

The present invention provides a semiconductor memory device that can minimize the widening of the threshold voltage distribution of cell transistors during a data erasing operation. The semiconductor memory device includes: a memory cell unit that is formed with nonvolatile memory cells connected in series, is divided into at least two groups each including one or more of the nonvolatile memory cells, and has one end connected to a source line and the other end connected to a bit line, word lines being connected to the gates of the nonvolatile memory cells, the voltages of the word lines being controlled to store data from the bit line or output stored data onto the bit line; and a voltage applying circuit that applies voltages to the word lines of the nonvolatile memory cells, applying a first voltage to the word lines of the nonvolatile memory cells of the group located closer to the bit line, and applying a second voltage to the word lines of the nonvolatile memory cells of the group located closer to the source line, with respect to the two adjacent groups of the memory cell unit, when a data erasing operation is performed to erase data stored in the nonvolatile memory cells forming the memory cell unit, the second voltage being higher than the first voltage.

22 Claims, 12 Drawing Sheets

NONVOLATILE SEMICONDUCTOR MEMORY DEVICE AND METHOD FOR CONTROLLING THE SAME

CROSS-REFERENCE TO RELATED APPLICATION

This application is based upon and claims the benefit of priority from prior Japanese Patent Application No. 2008-151807, filed on Jun. 10, 2008, the entire contents of which are incorporated herein by reference.

BACKGROUND OF THE INVENTION

1. Field of the Invention

The present invention relates to a nonvolatile semiconductor memory device and a method for controlling the nonvolatile semiconductor memory device. For example, the present invention relates to a NAND flash memory and a method for controlling the NAND flash memory.

2. Background Art

In recent years, NAND flash memories are widely used as large-capacity nonvolatile memories, especially for portable information terminals. One of the techniques for erasing data from a NAND flash memory involves withdrawing electrons from the floating gates of the cell transistors serving as memory cells toward the cell well side (the area in which the cell transistors are formed). More specifically, data erasing is performed by applying an erase voltage to the cell well and a predetermined voltage to all the word lines in a selected block (Japanese Patent Laid-Open No. 2005-116102).

After the data erasing operation is performed, an erase verifying operation is performed to confirm that the threshold voltages of all the cell transistors having the erase voltage applied thereto are equal to or smaller than the upper limit of the allowed threshold voltage range.

In this erase verifying operation, however, the lower limit of the threshold voltages is not controlled, and therefore, the threshold voltage distribution widens in the negative direction. The widening of the threshold voltage distribution is not preferable, leading to incorrect data writing and threshold voltage variations.

One of the conventional methods for narrowing a widened threshold voltage distribution is the method by which data rewriting called "soft write" (or "weak write") is performed after data erasing (Japanese Patent Laid-Open No. 2007-305204).

SUMMARY OF THE INVENTION

An embodiment of the present invention provides a semiconductor memory device that includes:

a memory cell unit that is formed with nonvolatile memory cells connected in series, is divided into at least two groups each including one or more of the nonvolatile memory cells, and has one end connected to a source line and the other end connected to a bit line, word lines being connected to the gates of the nonvolatile memory cells, the voltages of the word lines being controlled to store data from the bit line or output stored data onto the bit line; and a voltage applying circuit that applies voltages to the word lines of the nonvolatile memory cells, applying a first voltage to the word lines of the nonvolatile memory cells of the group located closer to the bit line, and applying a second voltage to the word lines of the nonvolatile memory cells of the group located closer to the source line, with respect to the two adjacent groups of the memory cell unit, when a data erasing operation is performed to erase data stored in the nonvolatile memory cells forming the memory cell unit, the second voltage being higher than the first voltage.

Another embodiment of the present invention provides a method for controlling a semiconductor device that includes:

a memory cell unit that is formed with nonvolatile memory cells connected in series, is divided into at least two groups each including one or more of the nonvolatile memory cells, and has one end connected to a source line and the other end connected to a bit line, word lines being connected to the gates of the nonvolatile memory cells, the voltages of the word lines being controlled to store data from the bit line or output stored data onto the bit line; and a voltage applying circuit that applies voltages to the word lines of the nonvolatile memory cells.

This method includes applying a first voltage to the word lines of the nonvolatile memory cells of the group located closer to the bit line, and applying a second voltage to the word lines of the nonvolatile memory cells of the group located closer to the source line, with respect to the two adjacent groups of the memory cell unit, when a data erasing operation is performed to erase data stored in the nonvolatile memory cells forming the memory cell unit, the second voltage being higher than the first voltage.

DESCRIPTION OF THE EMBODIMENTS

The structure of a NAND flash memory and an operation to erase data are described, before embodiments of the present invention are explained. Like components having like functions are denoted by like reference numerals, and repetitive explanation of them will not be repeated herein.

Figure 1:
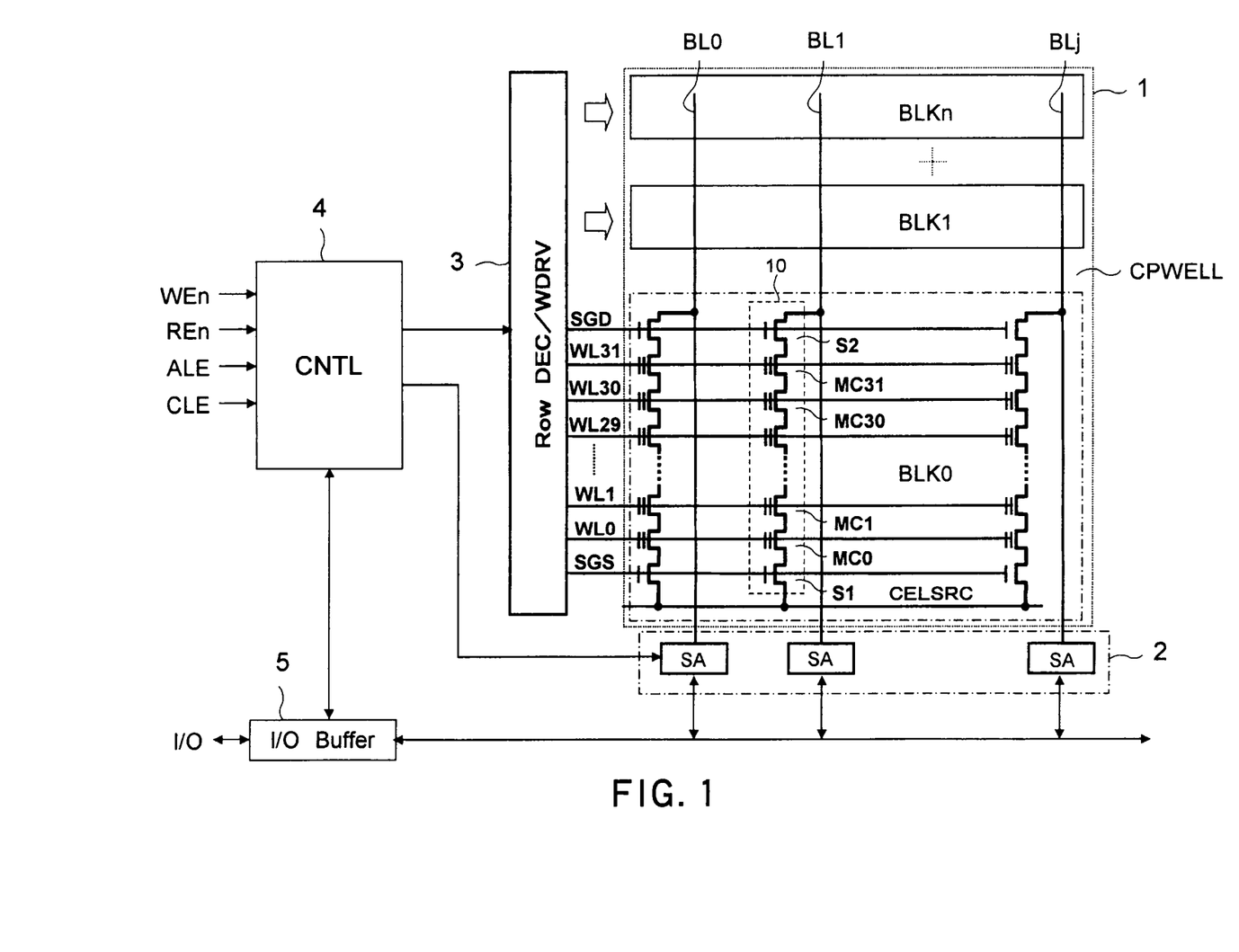
FIG. 1 schematically shows the structure of a flash memory.

FIG. 1 schematically shows the structure of a NAND flash memory. As can be seen from FIG. 1, the NAND flash memory includes a memory cell array 1, a sense amplifier circuit 2, a row decoder/word line driver 3, a controller 4, and a data input/output buffer 5.

The memory cell array 1 includes blocks BLK0, BLK1, ..., and BLKn. This memory cell array 1 is formed in a cell well (CPWELL) that is one of the doped regions in a silicon substrate. Data erasing is normally performed on a block-by-block basis. Each of the blocks BLK0, BLK1, ..., and BLKn includes NAND cell units 10, 10, .... Each of the NAND cell units 10 is formed with a NAND string having 32 cell transistors MC0, MC1, ..., and MC31 connected in series, and select gate transistors S1 and S2 connected to both ends of the NAND string, as shown in FIG. 1. Each two neighboring cell transistors share a source/drain diffusion layer. The source of the select gate transistor S1 is connected to a common source line (CELSRC), and the drain of the select gate transistor S2 is connected to a bit line BL. Each cell transistor is a nonvolatile memory element such as a field effect transistor (MOSFET) that has a floating gate structure. Each cell transistor may be a field effect transistor that has a MONOS (Metal-Oxide-Nitride-Oxide-Semiconductor) gate structure including a silicon nitride film for storing charges.

As can be seen from FIG. 1, the control gates of the cell transistors MC0, MC1, ..., and MC31 in the NAND cell units 10 are connected to word lines WL0, WL1, ..., and WL31, respectively. The gates of the select gate transistors S1 and S2 are connected to select gate lines SGS and SGD, respectively.

As can be seen from FIG. 1, the sense amplifier circuit 2 includes sense amplifiers SA. The sense amplifiers SA, SA, ... are connected to bit lines BL0, BL1, ..., and BLj, respectively, and sense read data. The sense amplifier circuit 2 has a column select gate (not shown). Although a sense amplifier is provided for each bit line in FIG. 1, one sense amplifier may be selectively connected to two or more bit lines.

The row decoder/word line driver 3 decodes address data that is transferred from the controller 4. The row decoder/word line driver 3 functions as a voltage applying circuit that applies a predetermined voltage to a selected word line and the select gate line in accordance with an operation mode.

The data input/output buffer (I/O Buffer) 5 exchanges data with the sense amplifier circuit 2 and an external input/output terminal (I/O). Also, the data input/output buffer 5 receives command data and address data from an external input terminal, and outputs the command data and the address data to the controller 4.

The controller 4 receives external control signals such as a write enable signal WEn, a read enable signal REn, an address latch enable signal ALE, and a command latch enable signal CLE, so as to control the entire memory operation. More specifically, the controller 4 has a command interface and an address holding/transferring circuit, and determines whether supplied data is write data or address data. The write data is transferred to the sense amplifier circuit 2, and the address data is transferred to the row decoder/word line driver 3.

Figure 2:
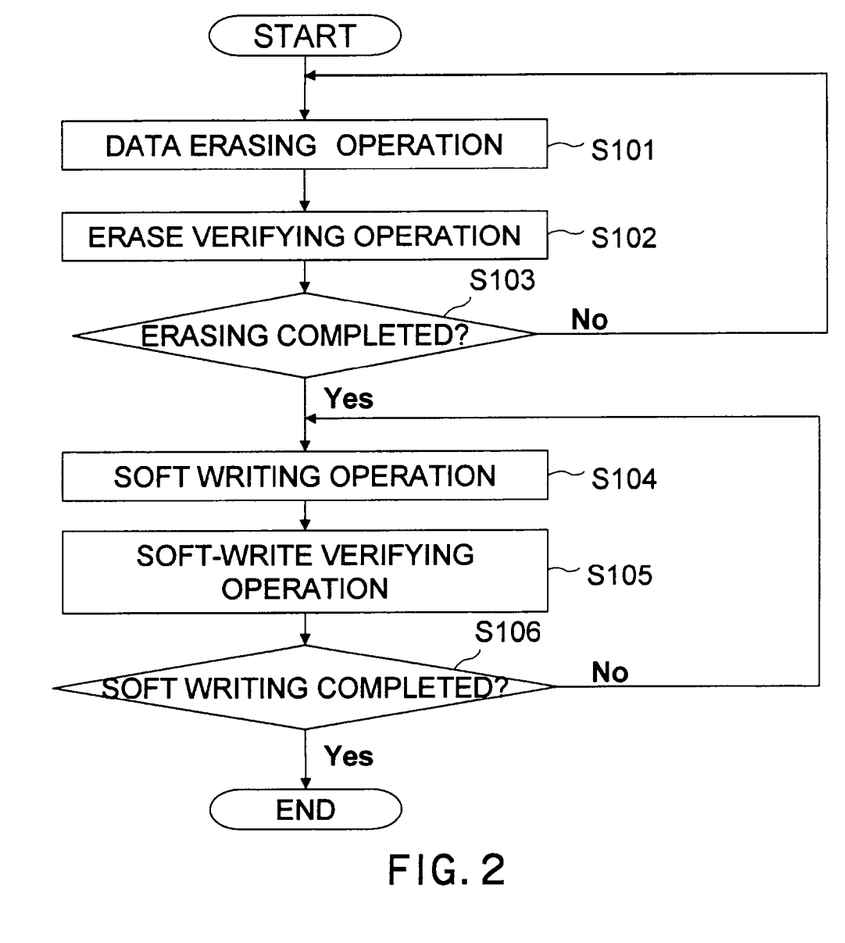
FIG. 2 is a flowchart of data erasing.

Next, a data erasing method is described. FIG. 2 is a flowchart of data erasing.

Figure 3:
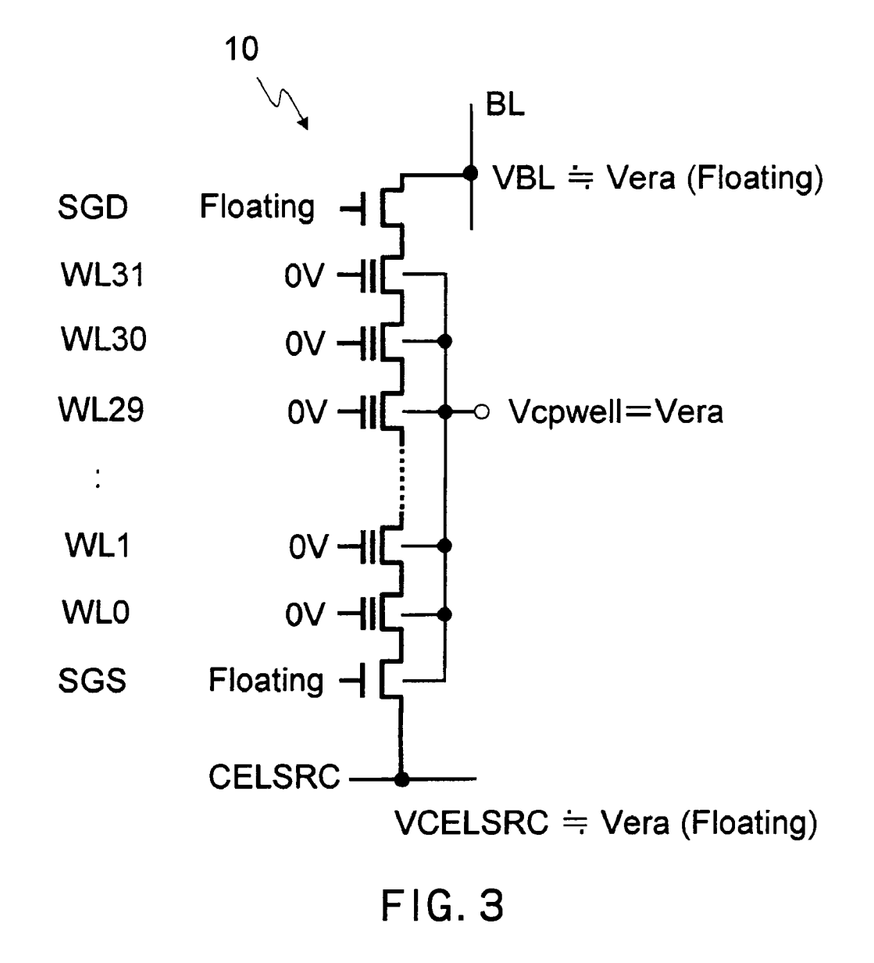
FIG. 3 shows the bias conditions of a NAND cell unit during a data erasing operation.

(1) First, a data erasing operation is performed (step S101). FIG. 3 shows the bias conditions of each NAND cell unit 10 observed during the data erasing operation. As can be seen from FIG. 3, 0 V is applied to all the word lines (WL0 through WL31) in the select block, and an erase voltage Vera (approximately 10 to 20 V) is applied to the cell well. The select gate lines SGS and SGD are put into a floating state, so that the gate oxide films of the select gate transistors S1 and S2 are not broken. The bit line BL and the common source line CELSRC are also put into a floating state. By setting the above bias conditions, the electrons in the floating gate of each cell transistor are drawn toward the cell well side. In this manner, the threshold voltage becomes lower, and the cell transistors turn into depression-type transistors.

In the data erasing operation, a predetermined voltage is applied to all the word lines, as described above. The timing to erase the data of the cell transistors varies in accordance with the data write states, the charge storage amounts, and the characteristics variations of the cell transistors (MC0 through MC31). Therefore, data is erased from the cell transistors is random order.

Figure 4:
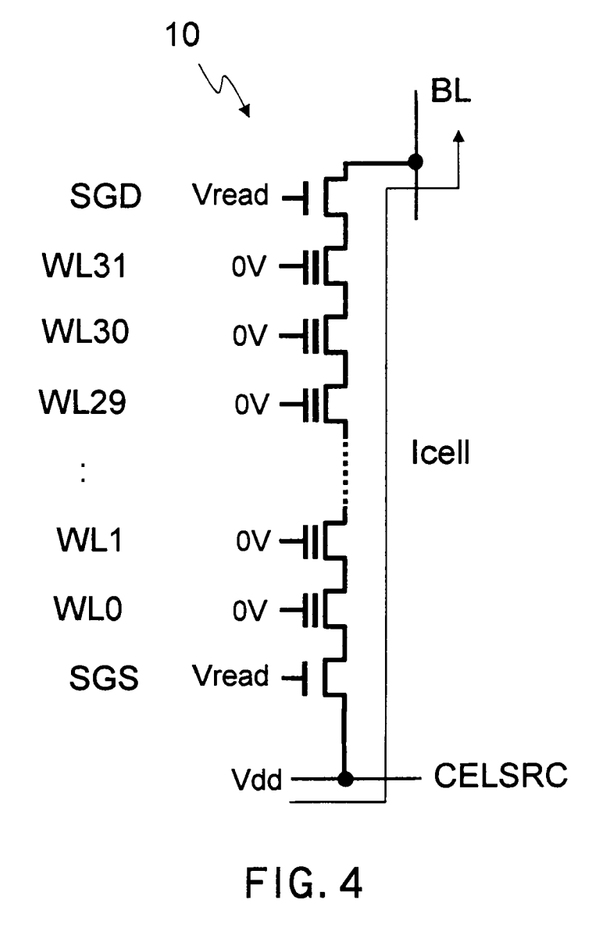
FIG. 4 shows the bias conditions of a NAND cell unit during an erase verifying operation.

(2) Next, an erase verifying operation is performed (step S102). FIG. 4 shows the bias conditions of each NAND cell unit 10, 10, ... observed during the erase verifying operation. As can be seen from FIG. 4, the bit line BL is precharged at 0 V, and a source voltage Vdd is applied to the common source line CELSRC. A voltage of 0 V is applied to all the word lines WL in the select block, and an intermediate voltage Vread that is high enough for switching on the select gate transistors S1 and S2 is applied to the select gate lines SGS and SGD. A cell current Icell flows from the common source line CELSRC, and the voltage that is output to the bit line is monitored.

(3) Next, a check is made to determine whether the data erasing has been completed (step S103). More specifically, when a voltage of a predetermined value or greater is output to the bit line, the data erasing is determined to have been completed. At this point, the threshold voltages of all the cell transistors constituting the NAND string 10 are equal to or lower than an erase verifying voltage Vev that is the upper limit of the allowable range of threshold voltage distribution.

When the voltage that is output to the bit line is less than the predetermined value, the data erasing is determined not to have been completed. In such a case, the data erasing operation and the erase verifying operation (steps S101 and S102) are again performed.

(4) Next, a soft writing operation is performed (step S104). In this operation, writing is performed to finely adjust cell transistors that have threshold voltages greatly shifted in the negative direction. By doing so, the threshold voltages are shifted in the positive direction, and the distribution of threshold voltages is narrowed.

(5) Next, a soft-write verifying operation is performed (step S105). In this operation, a negative threshold voltage reading operation that is the same as the erase verifying operation (step S102) is performed.

(6) Next, a check is made to determine whether the soft writing has been completed (step S106). The check is made in the following manner, for example. After the soft-write verifying operation, if the number of cell transistors having threshold voltages shifted to exceed the erase verifying voltage Vev in the positive direction is equal to or smaller than a predetermined number, the soft writing is determined to have been completed. If this requirement is not satisfied, the soft writing operation and the soft-write verifying operation (steps S104 and S105) are again performed.

The above described is the method of data erasing involving a soft writing operation.

Next, the mechanism to widen the threshold voltage distribution through the data erasing operation is described.

As described above, cell transistors are connected in series in the NAND flash memory. Therefore, in the erase verifying operation in which a current flows from the common source line to the bit line, the cell transistors close to the common source line have a higher diffusion layer potential on the bit line side. Meanwhile, the cell well potential is the same for each cell transistor.

Accordingly, the cell transistors closer to the common source line each have a greater back bias. Thus, the cell transistors closer to the common source line have higher threshold voltages, because of the substrate bias effect. In other words, as the cell transistor is closer to the common source line, the threshold voltage Vt' of the cell transistor during the erase verifying operation becomes greater than the threshold voltage Vt that is not affected by the back bias.

Therefore, each of the cell transistors having the threshold voltages made higher is not switched on during the erase verifying operation, unless the threshold voltage is reduced by the amount equivalent to the increase ΔVt (=Vt'−Vt) of the threshold voltage. If the cell transistors are not switched on, the data erasing is determined to be insufficient, and the data erasing operation is again performed.

As is apparent from the above explanation, the data erasing operation is repeated until the threshold voltage is excessively reduced by the amount equivalent to the increase ΔVt of the threshold voltage. As a result, excessive erasing is performed on the cell transistors closer to the common source line, and the threshold voltage distribution widens in the negative direction.

The above described is the technical knowledge acquired by the inventors, and cannot be known to the others skilled in the art. The present invention has been made based on the above knowledge.

The present invention is to solve the problem of widening of the threshold voltage distribution during the data erasing operation. More specifically, during the data erasing operation, the data stored in the cell transistors located closer to the bit line is preferentially erased. By doing so, an increase in the threshold voltage of each cell transistor on the common source line side due to the substrate bias effect can be restrained during the erase verifying operation. Accordingly, the number of times the data erasing operation is performed can be reduced. As a result, excessive erasing in the cell transistors can be prevented, and the widening of the threshold voltage distribution can be minimized in a case where the data erasing has been completed or where the data erasing is determined to have been completed in step S103.

In the following, three embodiments of the present invention are described, with reference to the accompanying drawings.

One of the features of each of the embodiments of the present invention is that, when a data erasing operation is performed, a voltage is applied to each word line (WL0 through WL31) in accordance with the position of the connected cell transistor. One of the differences among the embodiments is the number of kinds of voltage to be applied to word lines. In the first embodiment, there are two kinds of voltage to be applied to the word lines. In the second embodiment, there are three kinds of voltage to be applied to the word lines. In the third embodiment, a different voltage is applied to the word lines in each cell transistor.

FIRST EMBODIMENT

The first embodiment is now described. In this embodiment, each NAND string 10 is divided into two regions, and different voltages are applied to the word lines in the regions when the data erasing operation of step S101 is performed.

Figure 5:
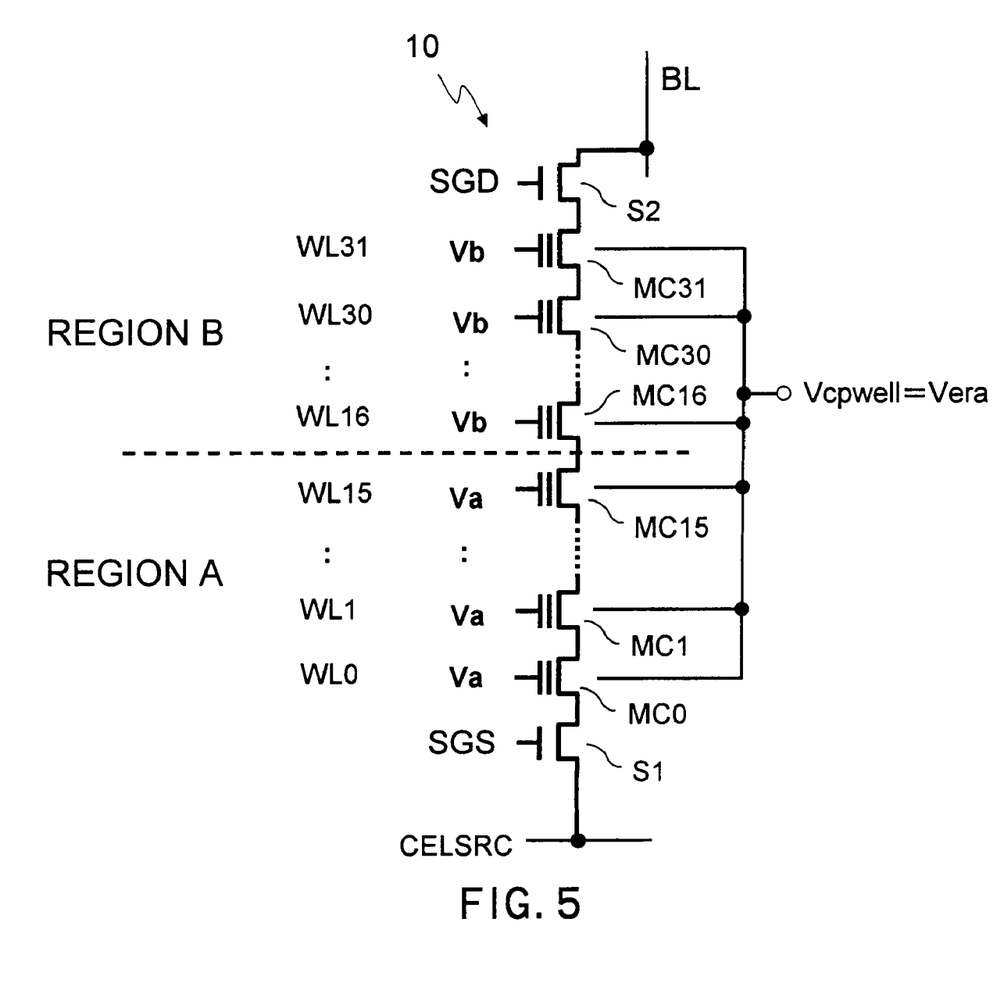
FIG. 5 shows the bias conditions of a NAND cell unit during a data erasing operation in accordance with a first embodiment of the present invention.

FIG. 5 shows the bias conditions of the NAND cell units 10 when the data erasing operation is performed in accordance with this embodiment. As shown in FIG. 5, a NAND string formed with thirty-two cell transistors MC0, MC1, . . . , and MC31 connected in series is divided into two regions: a region A on the common source line side and a region B on the bit line side. The region A includes the cell transistors MC0 through MC15. The region B includes the cell transistors MC16 through MC 31.

When the data erasing operation is performed, different voltages Va and Vb (Va>Vb) are applied to the word lines WL of the cell transistors belonging to the regions A and B. Referring now to the timing chart of the data erasing operation shown in FIG. 6, the first embodiment is described in greater detail.

Figure 6:
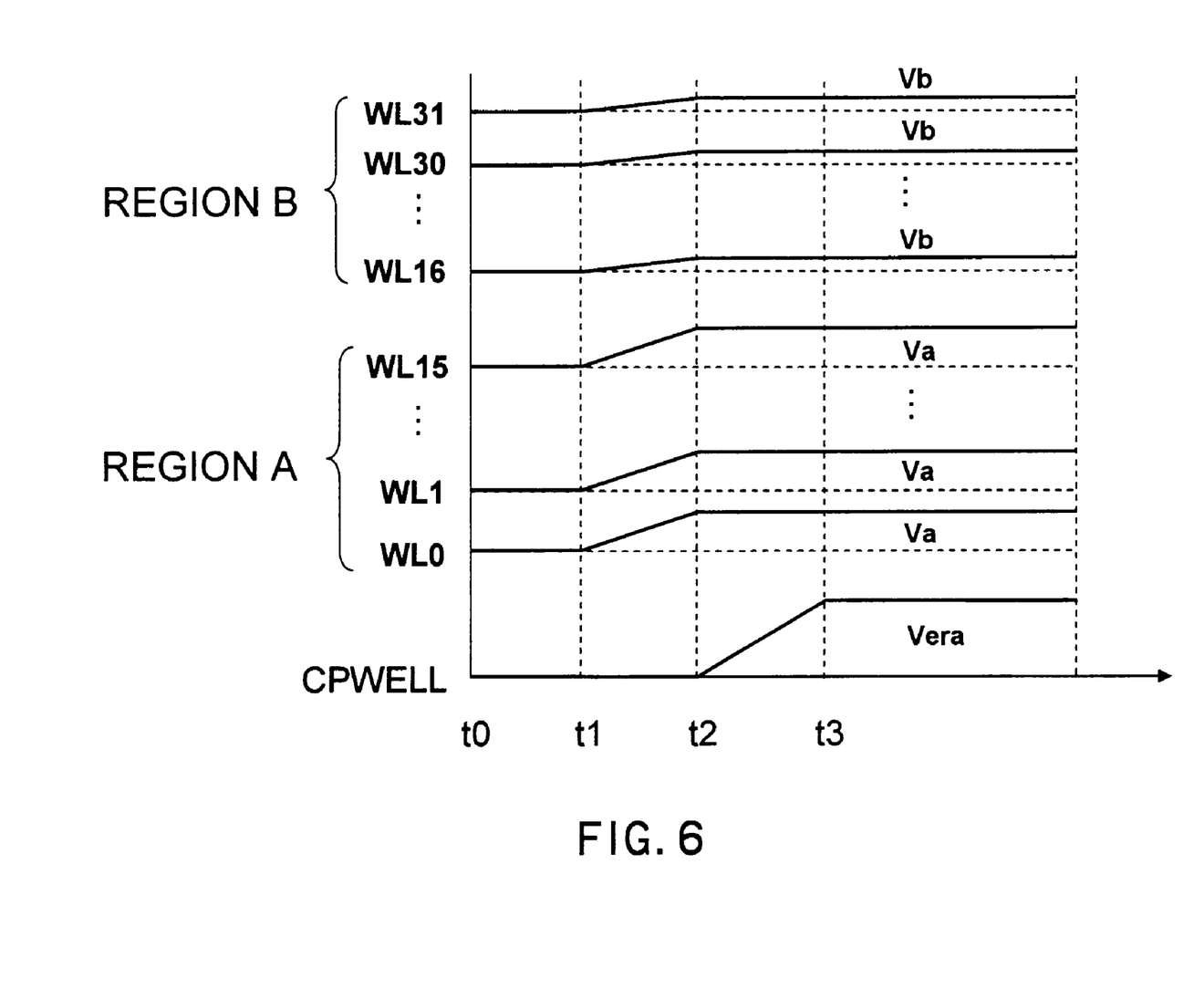
FIG. 6 is a timing chart of the data erasing operation in accordance with the first embodiment.

First, the row decoder/word line driver 3 applies voltages to the word lines WL0 through WL31 (time t1). The voltage Va is applied to the word lines WL0 through WL15, and the voltage Vb is applied to the word lines WL16 through WL31. The values of the voltages Va and Vb are adjusted in accordance with the characteristics variations of the cell transistors. For example, the voltage Va is in the range of 0.2 to 0.5 V, and the voltage Vb is 0V.

After the voltage of each word line reaches a predetermined value, a positive erase voltage Vera is applied to the cell well (p-well) (time t2). By doing so, a high electric field is generated between the floating gates of the cell transistors and the substrate, and the electrons in the floating gates are released toward the cell well side. Since the voltage Va is higher than the voltage Vb, the potential difference between each floating gate and the substrate in the region B is larger than the potential difference between each floating gate and the substrate in the region A. As a greater electric field is generated in the region B accordingly, the data stored in the cell transistors in the region B are easily erased. In this manner, the data stored in the region B is preferentially erased.

The erase voltage Vera is much higher than the voltages Va and Vb applied to the word lines, and may be 17 V, for example.

After the data erasing operation is performed to preferentially erase the data stored in the cell transistors on the bit line side in the above manner, the erase verifying operation (step S102) is performed. At this point, all the data in the region B has already been erased, and the threshold voltage of each cell transistor in the region B has become a small enough value to be switched on during the erase verifying operation. When the current Icell is caused to flow from the common source line to the bit line, each cell transistor in the region B can be regarded as resistance of a small value. Accordingly, the decrease in voltage in the region B is small. Since the bit line is precharged at a predetermined voltage (0 V, for example) during the erase verifying operation as described above, the potential of the diffusion layer of each cell transistor in the region A is lower than the potential observed in a case where erasing is performed by a conventional method. Accordingly, the back bias applied to each cell transistor in the region A becomes smaller than the back bias applied in a case where erasing is performed by a conventional method, and, because of that, the substrate bias effect is reduced. Thus, an increase in the threshold voltage of each cell transistor in the region A is restrained. In this manner, excessive erasing of the data stored in the cell transistors located in the region A can be prevented. As a result, the widening of the threshold voltage distribution due to data erasing can be reduced.

Figure 7:
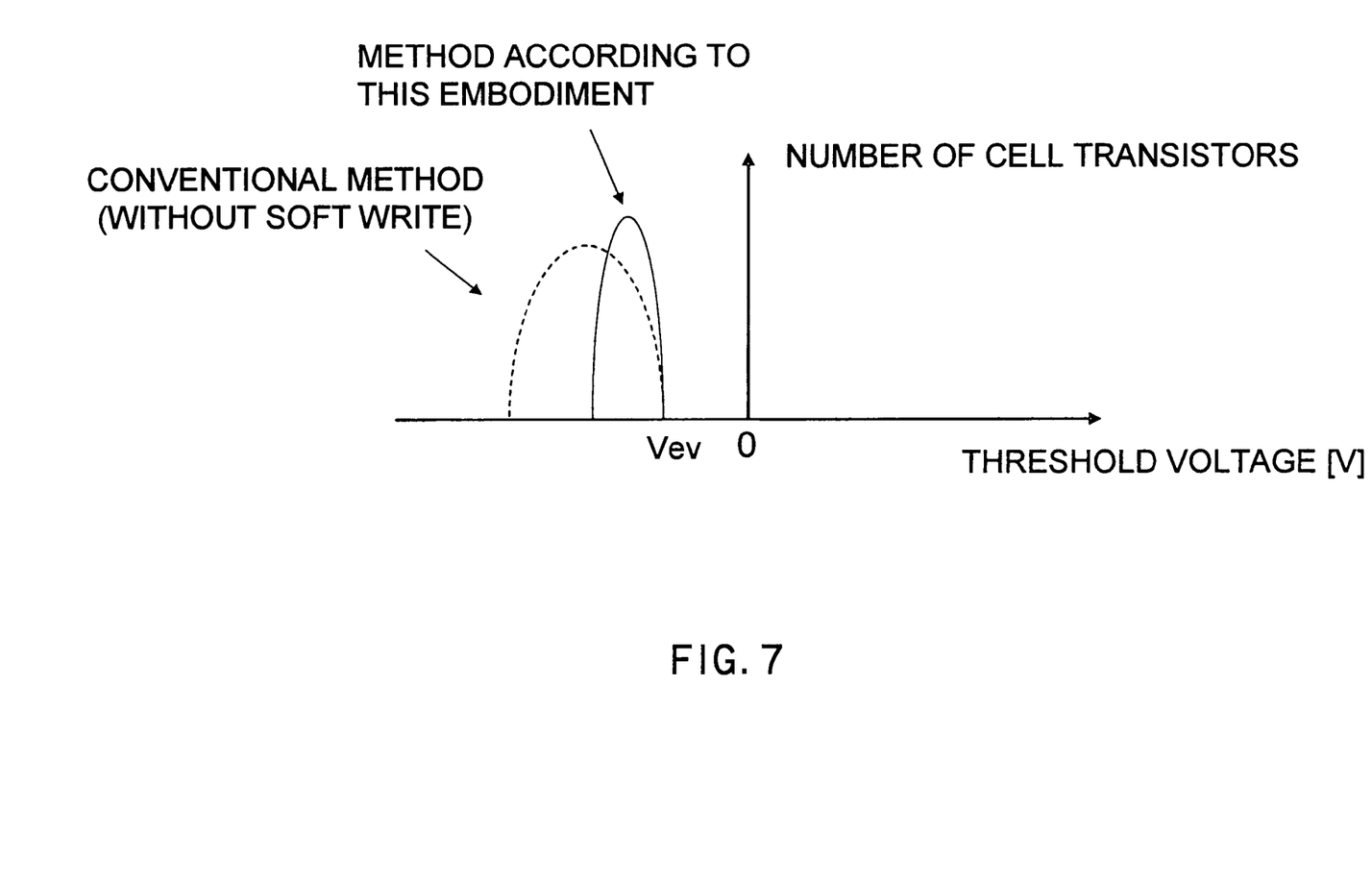
FIG. 7 shows the threshold voltage distribution in a data erased state.

FIG. 7 shows the distribution of threshold voltages in a data erased state. In FIG. 7, the solid line indicates the distribution of threshold voltages in the case of this embodiment, and the dotted line indicates the threshold voltage distribution observed in a case where soft writing is not performed according to a conventional method. As shown in FIG. 7, as excessive erasing is not performed on the cell transistors, the threshold voltage distribution does not widen in the negative direction in the case of this embodiment.

As described above, in accordance with this embodiment, the increase in the threshold voltage of each cell transistor located on the common source line side is restricted, so as to prevent excessive erasing of the data stored in the cell transistors located on the common source line side. Accordingly, the widening of the threshold voltage distribution due to data erasing can be made as small as possible. Also, by narrowing the threshold voltage distribution, the number of times the soft writing operation is performed can be reduced, or the soft writing operation can be made unnecessary.

SECOND EMBODIMENT

The second embodiment is now described. In this embodiment, each NAND string 10 is divided into three regions, and different voltages are applied to the word lines in the regions when the data erasing operation of step S101 is performed.

Figure 8:
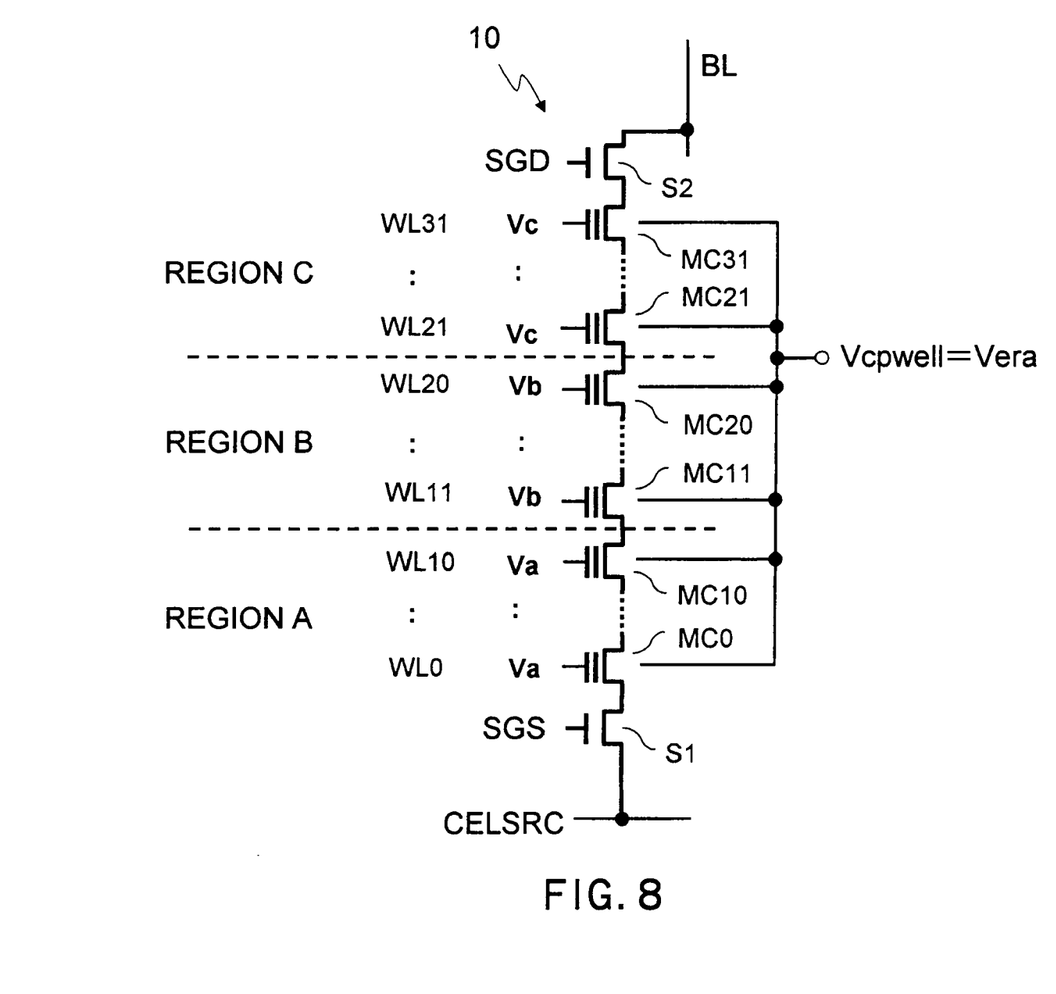
FIG. 8 shows the bias conditions of a NAND cell unit during a data erasing operation in accordance with a second embodiment.

FIG. 8 shows the bias conditions of the NAND cell units 10 when the data erasing operation is performed in accordance with this embodiment. As shown in FIG. 8, a NAND string formed with thirty-two cell transistors MC0, MC1, ..., and MC31 connected in series is divided into three regions: a region A on the common source line side, a region B in the middle, and a region C on the bit line side. The region A includes the cell transistors MC0 through MC10. The region B includes the cell transistors MC11 through MC 20. The region C includes the cell transistors MC21 through MC31.

When the data erasing operation is performed, different voltages Va, Vb, and Vc (Va>Vb>Vc) are applied to the word lines WL of the cell transistors belonging to the regions A, B, and C. Referring now to the timing chart of the data erasing operation shown in FIG. 9, the second embodiment is described in greater detail.

Figure 9:
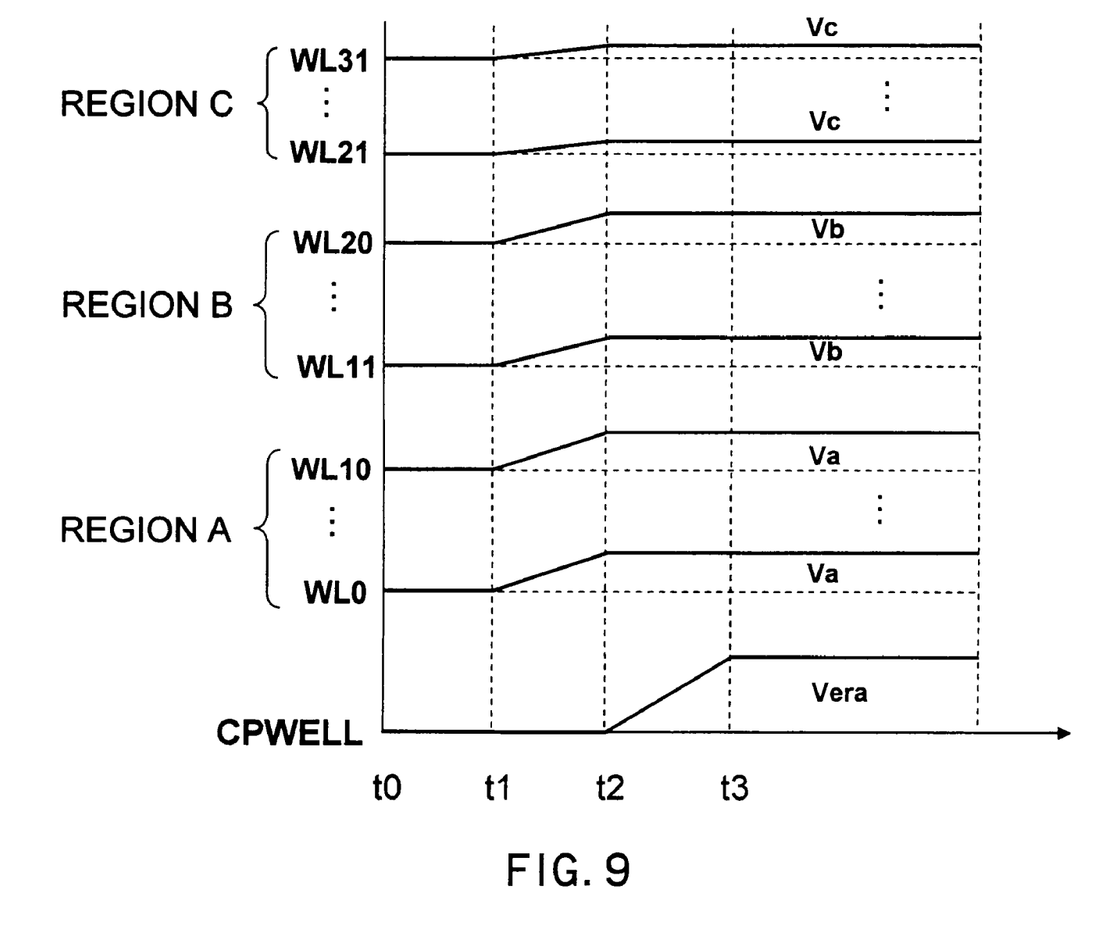
FIG. 9 is a timing chart of the data erasing operation in accordance with the second embodiment.

First, the row decoder/word line driver 3 applies voltages to the word lines WL0 through WL31 (time t1). The voltage Va is applied to the word lines WL0 through WL10, the voltage Vb is applied to the word lines WL11 through WL20, and the voltage Vc is applied to the word lines WL21 through WL31. The values of the voltages Va, Vb, and Vc are adjusted in accordance with the characteristics variations of the cell transistors. For example, the voltage Va is 2 V, the voltage Vb is 1 V, and the voltage Vc is 0V.

After the voltage of each word line reaches a predetermined value, a positive erase voltage Vera is applied to the cell well (p-well) (time t2). By doing so, a high electric field is generated between the floating gates of the cell transistors and the substrate, and the electrons in the floating gates are released toward the cell well side. Since the voltage Va is higher than the voltage Vb and the voltage Vb is higher than the voltage Vc, the potential difference between each floating gate and the substrate in the region C is larger than the potential difference between each floating gate and the substrate in the region B, and the potential difference between each floating gate and the substrate in the region B is larger than the potential difference between each floating gate and the substrate in the region A. As a greater electric field is generated accordingly, the data stored in the cell transistors in the region C are more easily erased than the data stored in the cell transistors in the region B, and the data stored in the cell transistors in the region B are more easily erased than the data stored in the cell transistors in the region A. In short, the data stored in the cell transistors is erased, with the order of priority being the region C, the region B, and the region A.

The erase voltage Vera is much higher than the voltages Va, Vb, and Vc applied to the word lines, and may be 17 V, for example.

After the data erasing operation is performed to preferentially erase the data stored in the cell transistors on the bit line side in the above manner, the erase verifying operation (step S102) is performed. At this point, all the data in the region C has already been erased, and the threshold voltage of each cell transistor in the region C has become a small enough value to be switched on during the erase verifying operation. When the current Icell is caused to flow from the common source line to the bit line, each cell transistor in the region C can be regarded as resistance of a small value. Accordingly, the decrease in voltage in the region C is small. Accordingly, the back bias applied to each cell transistor in the regions A and B becomes smaller than the back bias applied in a case where erasing is performed by a conventional method, and an increase in the threshold voltage of each cell transistor in the regions A and B is restrained. In this manner, excessive erasing of the data stored in the cell transistors located in the regions A and B can be prevented. The data erasing operation is then continued, and all the data in the region B is erased. At this point, the threshold voltage of each cell transistor in the regions B and C has become a small enough value to be switched on during the erase verifying operation. When the current Icell is caused to flow from the common source line to the bit line, each cell transistor in the regions B and C can be regarded as resistance of a small value. Accordingly, the decrease in voltage in the regions B and C is small. Accordingly, the back bias applied to each cell transistor in the region A becomes smaller than the back bias applied in a case where erasing is performed by a conventional method, and an increase in the threshold voltage of each cell transistor in the region A is restrained. In this manner, excessive erasing of the data stored in the cell transistors located in the region A can be prevented.

With the above arrangement, excessive erasing of the data stored in the cell transistors located on the common source line side can be prevented, and the widening of the threshold voltage distribution due to data erasing can be reduced.

In this embodiment, the number of regions is increased to three, which is greater than two in the first embodiment, so that the voltages to be applied to the word lines can be varied more minutely. Accordingly, the probability that excessive erasing is performed on the cell transistors located on the common source line side in the same region can be made lower. Thus, the effect to restrict the widening of the threshold voltage distribution can be made greater.

As described above, in accordance with this embodiment, the same effects as those of the first embodiment can be achieved, and the threshold voltage distribution can be made even narrower than in the first embodiment.

THIRD EMBODIMENT

The third embodiment is now described. In this embodiment, each NAND string 10 is divided into thirty-two regions, which is the same as the number of cell transistors included in the NAND string. A different voltage is applied to the word lines in each of the regions belonging to the cell transistors when the data erasing operation of step S101 is performed.

Figure 10:
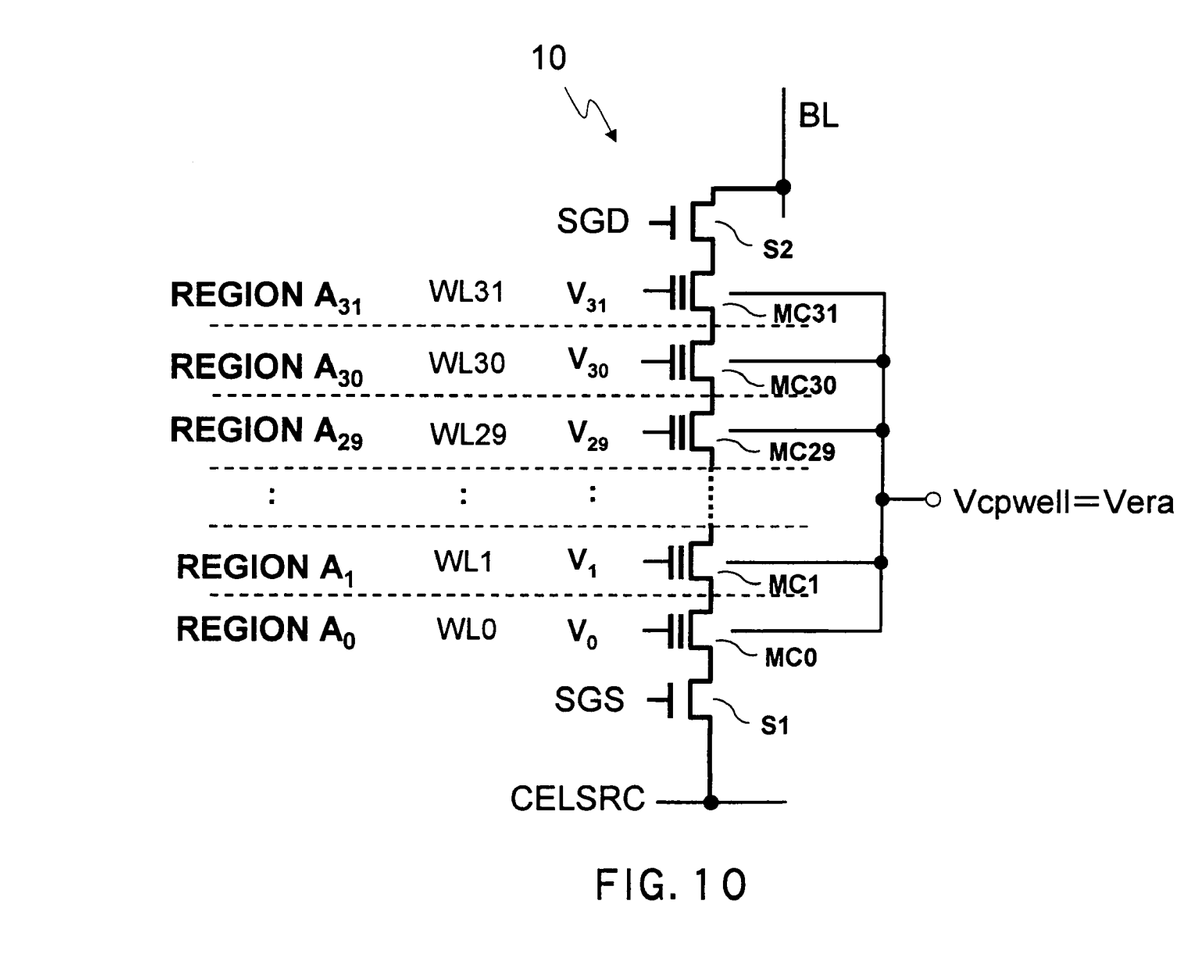
FIG. 10 shows the bias conditions of a NAND cell unit during a data erasing operation in accordance with a third embodiment.

FIG. 10 shows the bias conditions of the NAND cell units 10 when the data erasing operation is performed in accordance with this embodiment. As shown in FIG. 10, a NAND string formed with thirty-two cell transistors MC0, MC1, ..., and MC31 connected in series is divided into thirty-two regions: a region $A_0$, a region $A_1$, ..., and a region $A_{31}$ in this order, when seen from the common source line side. Each region $A_i$ (i=0, 1, ..., 31) includes a cell transistor MCi.

When the data erasing operation is performed, different voltages $V_0, V_1, \ldots,$ and $V_{31}$ ($V_0 > V_1 > \ldots > V_{31}$) are applied to the word lines WL of the cell transistors belonging to the regions $A_0, A_1, \ldots,$ and $A_{31}$. Referring now to the timing chart of the data erasing operation shown in FIG. 11, the third embodiment is described in greater detail.

Figure 11:
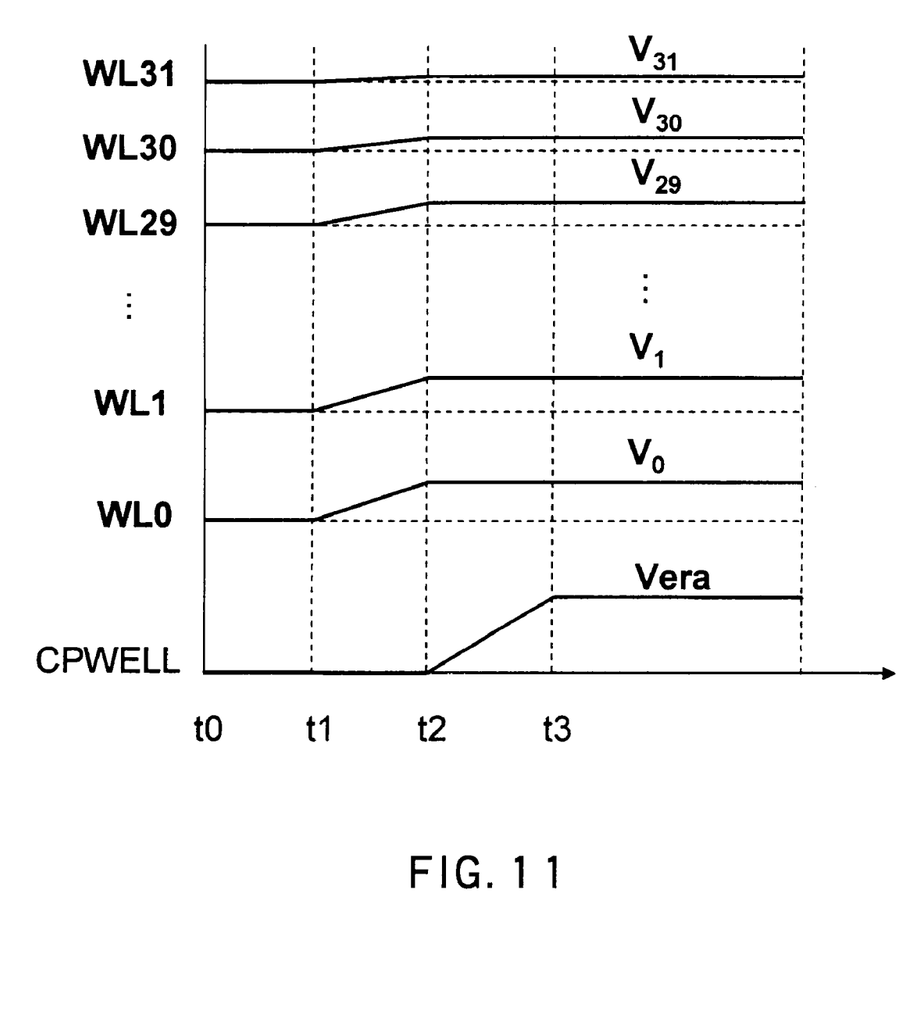
FIG. 11 is a timing chart of the data erasing operation in accordance with the third embodiment.

First, the row decoder/word line driver 3 applies voltages to the word lines WL0 through WL31 (time t1). The different voltages $V_0, V_1, \ldots,$ and $V_{31}$ are applied to the word lines WL0 through WL31. The values of the voltages $V_i$ (i=0, 1, ..., and 31) are adjusted in accordance with the characteristics variations of the cell transistors. For example, the voltage $V_0$=2 V, the voltage $V_1$=2−0.0645 V, ..., $V_i$=2−0.0645*i, ..., and the voltage $V_{31}$=0 V.

After the voltage of each word line reaches a predetermined value, a positive erase voltage Vera is applied to the cell well (p-well) (time t2). By doing so, a high electric field is generated between the floating gates of the cell transistors and the substrate, and the electrons in the floating gates are released toward the cell well side. Since the relationship among the voltages is expressed as $V_0 > V_1 > \ldots > V_{31}$, the potential difference between the floating gate of a cell transistor closer to the bit line BL side and the substrate is larger. As a greater electric field is generated accordingly, the data stored in the cell transistors closer to the bit line side are more easily erased. In short, the data stored in the cell transistors closer to the bit line side is preferentially erased.

The erase voltage Vera is much higher than the voltages $V_i$ applied to the word lines, and may be 17 V, for example.

After the data erasing operation is performed to preferentially erase the data stored in the cell transistors on the bit line side in the above manner, the erase verifying operation (step S102) is performed. Here, a cell transistor MCi is described. All the data stored in the cell transistors MCi+1, ..., and MC31 located on the bit line side of the cell transistor MCi have already been erased, and the threshold voltages of those cell transistors have become small enough values to be switched on during the erase verifying operation. At this point, each of the cell transistors MCi+1, ..., and MC31 can be regarded as resistance of a small value. Accordingly, the decrease in voltage in each of the regions $A_{i+1}$ through $A_{31}$ is small. Accordingly, the back bias applied to each of the cell transistors MC0, MC1, ..., MCi on the common source line side becomes smaller than the back bias applied in a case where erasing is performed by a conventional method, and an increase in the threshold voltage of each of the cell transistors MC0, MC1, ..., and MCi in the regions $A_0$ through $A_i$ is restrained. In this manner, excessive erasing of the data stored in the cell transistors located in the regions $A_0$ through $A_i$ can be prevented, and the widening of the threshold voltage distribution due to data erasing can be reduced.

In this embodiment, a different voltage is applied in accordance with the position of each cell transistor, so that the probability that excessive erasing is performed on the cell transistors can be made lower. Thus, the effect to restrict the widening of the threshold voltage distribution can be made greater.

As described above, in accordance with this embodiment, the same effects as those of the first embodiment can be achieved, and the threshold voltage distribution can be made even narrower than in the first and second embodiments.

The three embodiments involving different region dividing techniques have been described so far. However, the region dividing techniques are not limited to those of the above embodiments, and any other suitable technique may be employed. The number of cell transistors is not limited to the above value (32) either, and may be 8, 16, 64, or 128, for example.

Figure 12:
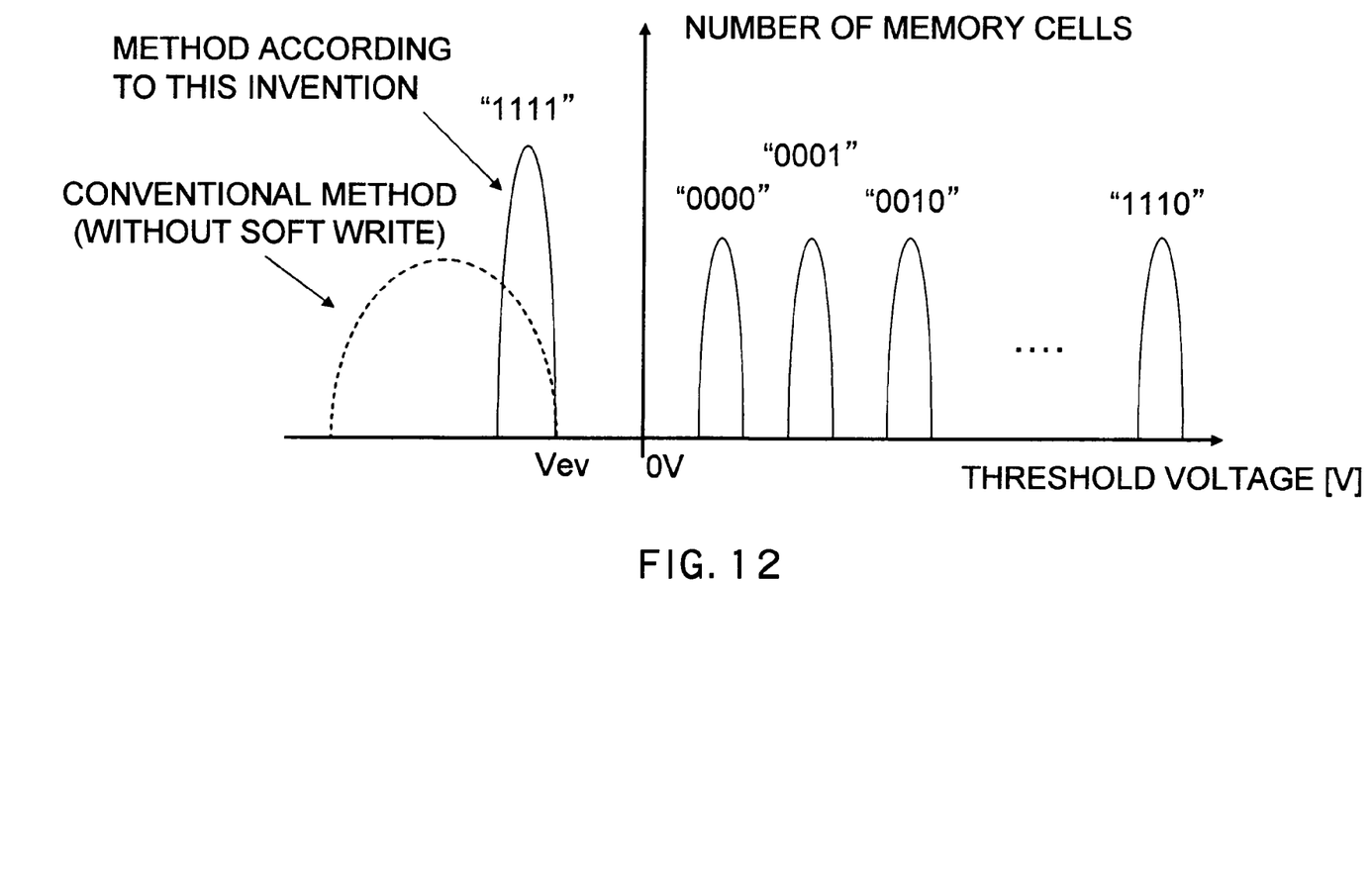
FIG. 12 shows an example of the threshold voltage distribution and data bit allocation in a 16-value memory.

The present invention is also suitable in a multivalue storing case where a number of bits are stored in each cell transistor. FIG. 12 shows an example of the threshold voltage distribution of a 16-value memory and the data bit allocation. As can be seen from FIG. 12, the threshold voltage distribution in a data written state needs to be made narrower, as the number of values that can be stored in each cell transistor becomes greater. Therefore, the threshold voltage distribution in a data erased state should be narrow. In accordance with the present invention, the widening of the threshold voltage distribution in a data erased state is reduced, and accordingly, write control can be performed more minutely. Thus, the threshold voltage distribution in a data written state can be made even narrower.

Additional advantages and modifications will readily occur to those skilled in the art.

Therefore, the invention in its broader aspects is not limited to the specific details and representative embodiments shown and described herein.

Accordingly, various modifications may be made without departing from the spirit or scope of the general inventive concepts as defined by the appended claims and their equivalents.

The invention claimed is:

1. A semiconductor memory device comprising:
a memory cell unit that is formed with a plurality of nonvolatile memory cells connected in series, is divided into at least two groups each including one or more of the nonvolatile memory cells, and has one end connected to a source line and the other end connected to a bit line, word lines being connected to gates of the nonvolatile memory cells, voltages of the word lines being controlled to store data from the bit line or output stored data onto the bit line; and
a voltage applying circuit that applies voltages to the word lines of the nonvolatile memory cells, applying a first voltage to the word lines of the nonvolatile memory cells of the group located closer to the bit line, applying a second voltage which is higher than the first voltage to the word lines of the nonvolatile memory cells of the group located closer to the source line, with respect to the two adjacent groups of the memory cell unit, and applying an erase voltage which is higher than the first and second voltages to the cell well where the nonvolatile memory cells are formed, when a data erasing operation is performed to erase data stored in the nonvolatile memory cells forming the memory cell unit.

2. The semiconductor memory device according to claim 1, wherein
when the data erasing operation is performed, the voltage applying circuit applies a predetermined voltage to the word lines of the nonvolatile memory cells of the group closest to the bit line among the groups, and applies higher voltages to the word lines of the nonvolatile memory cells of the other groups, each of the higher voltages being higher than the voltage applied to the word lines of the nonvolatile memory cells of the adjacent group on the bit line side by a constant value.

3. The semiconductor memory device according to claim 2, wherein
the number of nonvolatile memory cells included in each of the groups is 1.

4. The semiconductor memory device according to claim 3, wherein
the nonvolatile memory cell is of a multivalue type that stores a plurality of bits.

5. The semiconductor memory device according to claim 4, wherein
the nonvolatile memory cell is a field effect transistor having a floating gate structure.

6. The semiconductor memory device according to claim 4, wherein
the nonvolatile memory cell is a field effect transistor having a MONOS (Metal-Oxide-Nitride-Oxide-Semiconductor) gate structure.

7. The semiconductor memory device according to claim 2, wherein
the nonvolatile memory cell is of a multivalue type that stores a plurality of bits.

8. The semiconductor memory device according to claim 1, wherein
the number of nonvolatile memory cells included in each of the groups is 1.

9. The semiconductor memory device according to claim 8, wherein
the nonvolatile memory cell is a field effect transistor having a floating gate structure.

10. The semiconductor memory device according to claim 8, wherein
the nonvolatile memory cell is a field effect transistor having a MONOS (Metal-Oxide-Nitride-Oxide-Semiconductor) gate structure.

11. The semiconductor memory device according to claim 1, wherein
the nonvolatile memory cell is of a multivalue type that stores a plurality of bits.

12. The semiconductor memory device according to claim 1, wherein
the nonvolatile memory cell is a field effect transistor having a floating gate structure.

13. The semiconductor memory device according to claim 1, wherein
the nonvolatile memory cell is a field effect transistor having a MONOS (Metal-Oxide-Nitride-Oxide-Semiconductor) gate structure.

14. A method for controlling a semiconductor memory device that includes:
a memory cell unit that is formed with a plurality of nonvolatile memory cells connected in series, is divided into at least two groups each including one or more of the nonvolatile memory cells, and has one end connected to a source line and the other end connected to a bit line, word lines being connected to gates of the nonvolatile memory cells, voltages of the word lines being controlled to store data from the bit line or output stored data onto the bit line; and
a voltage applying circuit that applies voltages to the word lines of the nonvolatile memory cells,
the method comprising applying a first voltage to the word lines of the nonvolatile memory cells of the group located closer to the bit line, and applying a second voltage which is higher than the first voltage to the word lines of the nonvolatile memory cells of the group located closer to the source line, with respect to the two adjacent groups of the memory cell unit, and applying an erase voltage which is higher than the first and second voltages to the cell well where the nonvolatile memory cells are formed, when a data erasing operation is performed to erase data stored in the nonvolatile memory cells forming the memory cell unit.

15. The method according to claim 14, wherein
when the data erasing operation is performed, the voltage applying circuit applies a predetermined voltage to the word lines of the nonvolatile memory cells of the group closest to the bit line among the groups, and applies higher voltages to the word lines of the nonvolatile memory cells of the other groups, each of the higher voltages being higher than the voltage applied to the word lines of the nonvolatile memory cells of the adjacent group on the bit line side by a constant value.

16. The method according to claim 15, wherein
the number of nonvolatile memory cells included in each of the groups is 1.

17. The method according to claim 16, wherein
the nonvolatile memory cell is of a multivalue type that stores a plurality of bits.

18. The method according to claim 17, wherein
the nonvolatile memory cell is a field effect transistor having a floating gate structure.

19. The method according to claim 17, wherein
the nonvolatile memory cell is a field effect transistor having a MONOS (Metal-Oxide-Nitride-Oxide-Semiconductor) gate structure.

20. The method according to claim 14, wherein
the number of nonvolatile memory cells included in each of the groups is 1.

21. The semiconductor memory device according to claim 1, wherein the voltage applying circuit applies the first and the second voltages from the beginning of the data erasing operation.

22. The method according to claim 14, wherein the first and the second voltages are applied to the word lines from the beginning of the data erasing operation.

* * * * *